United States Patent
Satou

(10) Patent No.: US 11,211,899 B2
(45) Date of Patent: Dec. 28, 2021

(54) POWER AMPLIFYING CIRCUIT

(71) Applicant: Murata Manufacturing Co., Ltd., Kyoto (JP)

(72) Inventor: Hideyuki Satou, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 99 days.

(21) Appl. No.: 16/823,815

(22) Filed: Mar. 19, 2020

(65) Prior Publication Data

US 2020/0304072 A1 Sep. 24, 2020

(30) Foreign Application Priority Data

Mar. 22, 2019 (JP) .............................. JP2019-055250

(51) Int. Cl.
*H03F 1/02* (2006.01)
*H03F 3/217* (2006.01)
*H03F 1/56* (2006.01)

(52) U.S. Cl.
CPC ............ *H03F 1/0211* (2013.01); *H03F 1/56* (2013.01); *H03F 3/217* (2013.01); *H03F 2200/387* (2013.01); *H03F 2200/451* (2013.01)

(58) Field of Classification Search
CPC .......... H03F 1/0211; H03F 1/56; H03F 3/217; H03F 2200/387; H03F 2200/451
USPC ........................................................ 330/296
See application file for complete search history.

(56) References Cited

U.S. PATENT DOCUMENTS 9,041,472 B2* 5/2015 Chen ................... H01L 21/8249
330/307
2007/0024370 A1 2/2007 Hirata et al.

FOREIGN PATENT DOCUMENTS

CN 110190824 A * 8/2019
JP 2007-036973 A 2/2007

OTHER PUBLICATIONS

Dunn, J., "Active bias control", published in EDN, on Nov. 6, 2018 (Year: 2018).*
Nitesh et al., "A 0.8 mm2 Sub-GHz GaAs HBT Power Amplifier for 5G Application Achieving 57.5% PAE and 28.5 dBm Maximum Linear Output Power", published in IEEE Access Oct. 24, 2019 (Year: 2019).*

* cited by examiner

*Primary Examiner* — Robert J Pascal
*Assistant Examiner* — Hafizur Rahman
(74) *Attorney, Agent, or Firm* — Pearne & Gordon LLP

(57) ABSTRACT

A power amplifying circuit includes a bias circuit that supplies a bias current or a bias voltage to a base of a first transistor, and at least one termination circuit that short-circuits a second-order harmonic of an amplified signal output from a collector of the first transistor to a ground voltage. An emitter of the first transistor is connected to ground. The bias circuit includes a second transistor. A collector of the second transistor is connected to the base of the first transistor. An emitter of the second transistor is connected to the emitter of the first transistor. A base of the second transistor is supplied with a predetermined voltage.

19 Claims, 10 Drawing Sheets

POWER AMPLIFYING CIRCUIT

This application claims priority from Japanese Patent Application No. 2019-055250 filed on Mar. 22, 2019. The content of this application is incorporated herein by reference in its entirety.

BACKGROUND

The present disclosure relates to a power amplifying circuit. In communication using a radio frequency (RF) signal of a mobile apparatus such as a cellular phone, a power amplifying circuit is used to amplify the RF signal. When amplifying the RF signal, the power amplifying circuit is requested to reduce power consumption in the power amplifying circuit. Japanese Unexamined Patent Application Publication No. 2007-36973 discloses a power amplifying circuit that compensates for amplification distortion and phase distortion that occur in the power amplifying circuit to reduce power consumption.

BRIEF SUMMARY

To reduce power consumption in a power amplifying circuit, it is important to enhance power-added efficiency (PAE). A configuration for causing a power amplifying circuit to perform class-F operation is an example of a technique for achieving both high linearity and high efficiency in the power amplifying circuit. In class-F operation, harmonics are controlled such that even-order harmonics included in an RF signal output from the power amplifying circuit are short-circuited to a ground voltage and that odd-order harmonics included in the RF signal are open-circuited.

Harmonics control in class-F operation is performed to prevent overlap in a time domain between the waveform of a collector voltage and the waveform of a collector current of an amplifier of the power amplifying circuit. This enables the power consumption of the amplifier, which is the product of the collector voltage and the collector current of the amplifier, to ideally be 0 W.

However, in an actual power amplifying circuit, it is difficult to ideally control the waveform of a collector voltage and the waveform of a collector current, and overlap between the waveforms occurs. The overlap between the waveforms generates dissipative power, which is the product of the collector voltage and the collector current. The generation of dissipative power leads to an increase in power consumption, resulting in a decrease in PAE.

The present disclosure enhances the PAE of a power amplifying circuit that controls harmonics.

According to embodiments of the present disclosure, a power amplifying circuit includes a first transistor including a base, a collector, and an emitter; a bias circuit that supplies a bias current or a bias voltage to the base of the first transistor; and at least one termination circuit that short-circuits a second-order harmonic of an amplified signal to a ground voltage, the amplified signal being output from the collector of the first transistor. The emitter of the first transistor is connected to ground. The bias circuit includes a second transistor including a base, a collector, and an emitter. The collector of the second transistor is connected to the base of the first transistor. The emitter of the second transistor is connected to the emitter of the first transistor. The base of the second transistor is supplied with a predetermined voltage.

According to embodiments of the present disclosure, it is possible to enhance the PAE of a power amplifying circuit that controls harmonics.

Other features, elements, characteristics and advantages of the present disclosure will become more apparent from the following detailed description of embodiments of the present disclosure with reference to the attached drawings.

DETAILED DESCRIPTION

Figure 1:
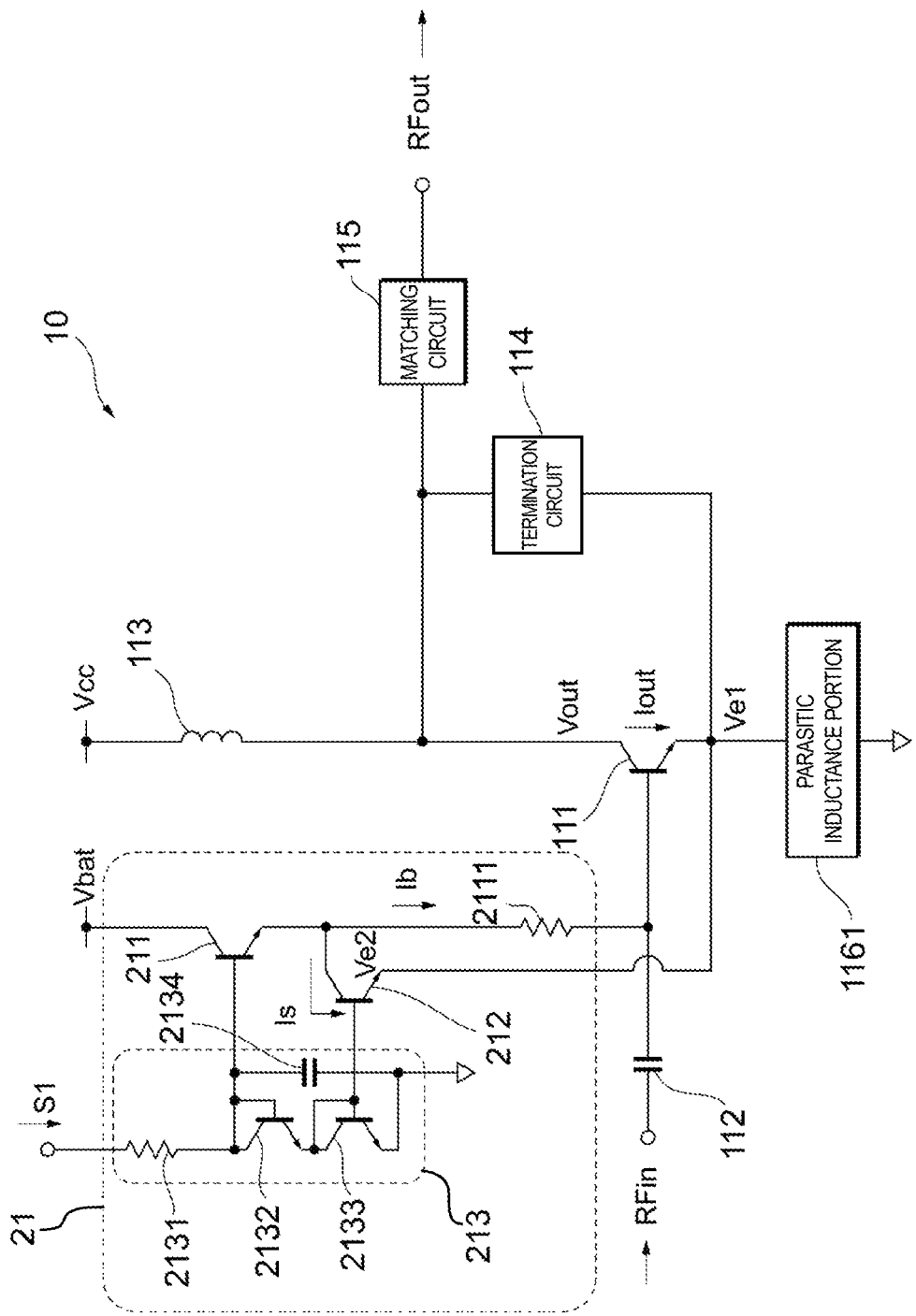
FIG. 1 is a diagram illustrating an example configuration of a power amplifying circuit according to a first embodiment.

Hereinafter, embodiments of the present disclosure will be described in detail with reference to the drawings. The same components will be denoted by the same reference numerals, and a duplicate description will be omitted as much as possible.

A power amplifying circuit 10 according to a first embodiment will be described with reference to FIG. 1. The power amplifying circuit 10 includes a transistor 111, a capacitor 112, an inductor 113, a termination circuit 114, a matching circuit 115, and a bias circuit 21.

The transistor 111 is, for example, a heterojunction bipolar transistor (HBT) or the like. In an embodiment of the present disclosure, the transistor 111 is not limited to an HBT and may be another type of transistor, such as a field-effect transistor (FET).

The transistor 111 (a first transistor) includes a collector that is connected to the inductor 113, the termination circuit 114, and the matching circuit 115. The collector of the transistor 111 is supplied with a power supply voltage Vcc through the inductor 113.

The transistor 111 includes a base that is connected to one end of the capacitor 112. An input signal RFin is input to the other end of the capacitor 112. The base of the transistor 111 is connected to the bias circuit 21. The bias circuit 21 will be described below. The transistor 111 includes an emitter that is connected to ground.

There is a parasitic inductance component between the emitter of the transistor 111 and ground. In this embodiment, it is assumed that the parasitic inductance component between the emitter of the transistor 111 and ground derives from a parasitic inductance portion 1161. The parasitic inductance portion 1161 is made up of, for example, a wiring line of the power amplifying circuit 10.

The capacitor 112 is disposed to remove a direct-current (DC) component included in the input signal RFin. The inductor 113 is disposed to suppress coupling of an RF signal to a power supply circuit.

The termination circuit 114 includes one end that is connected to the collector of the transistor 111 and includes the other end that is connected to ground via the parasitic inductance portion 1161.

The termination circuit 114 includes, for example, an inductor and a capacitor connected in series to each other. In the termination circuit 114, an inductance component of the inductor and a capacitance component of the capacitor form an LC series resonant circuit. With use of the LC series resonant circuit, the termination circuit 114 short-circuits a second-order harmonic in an RF signal output from the collector of the transistor 111 to a ground voltage.

The matching circuit 115 includes one end that is connected to the collector of the transistor 111. The matching circuit 115 includes the other end that outputs an output signal RFout. The matching circuit 115 is disposed to achieve impedance matching between circuits.

By terminating the second-order harmonic in the RF signal output from the collector of the transistor 111, the waveform of a collector current Iout of the transistor 111 can be made closer to a half-wave rectified waveform, and the waveform of a collector voltage Vout of the transistor 111 can be made closer to a rectangular waveform.

The bias circuit 21 includes transistors 211 and 212 and a voltage supply portion 213. The transistors 211 and 212 include respective bases each of which is supplied with a predetermined voltage from the voltage supply portion 213.

The transistor 211 includes a collector that is supplied with a battery voltage Vbat. The transistor 211 includes an emitter that is connected to the base of the transistor 111 via a resistance element 2111.

The transistor 212 (a second transistor) includes a collector that is connected between the transistor 211 and the resistance element 2111. The transistor 212 includes an emitter that is connected to the emitter of the transistor 111.

The transistors 211 and 212 determine a bias current Ib to be supplied to the base of the transistor 111.

The voltage supply portion 213 includes a resistance element 2131, a transistor 2132, a transistor 2133, and a capacitor 2134.

The transistor 2132 includes a collector and a base that are connected to each other. A control signal S1 is input to the collector of the transistor 2132 from an external control integrated circuit (IC) through the resistance element 2131. The base of the transistor 2132 is connected to the base of the transistor 211.

The transistor 2133 includes a collector that is connected to an emitter of the transistor 2132. The transistor 2133 includes the collector and a base that are connected to each other. The transistor 2133 includes an emitter that is connected to ground. The base of the transistor 2133 is connected to the base of the transistor 212.

The capacitor 2134 includes one end that is connected to the base of the transistor 211 and includes the other end that is grounded. The capacitor 2134 causes the base voltage of the transistor 211 to be alternating-current (AC) grounded.

A predetermined voltage (for example, about 2.6 V) is supplied from the transistor 2132 to the base of the transistor 211. A predetermined voltage (for example, about 1.3 V) is supplied from the transistor 2133 to the base of the transistor 212. Alternatively, diode elements may be used instead of the transistors 2132 and 2133.

An operation of the power amplifying circuit 10 will be described with reference to FIGS. 1 to 5. In a case where the input signal RFin is input to the power amplifying circuit 10, an RF signal including an AC component of the input signal RFin and a DC signal composed of the bias current Ib is input to the base of the transistor 111.

The transistor 111 amplifies the signal input to the base of the transistor 111. An amplified signal is output as a result of fluctuation of the collector voltage Vout and the collector current Iout of the transistor 111.

Figure 9:
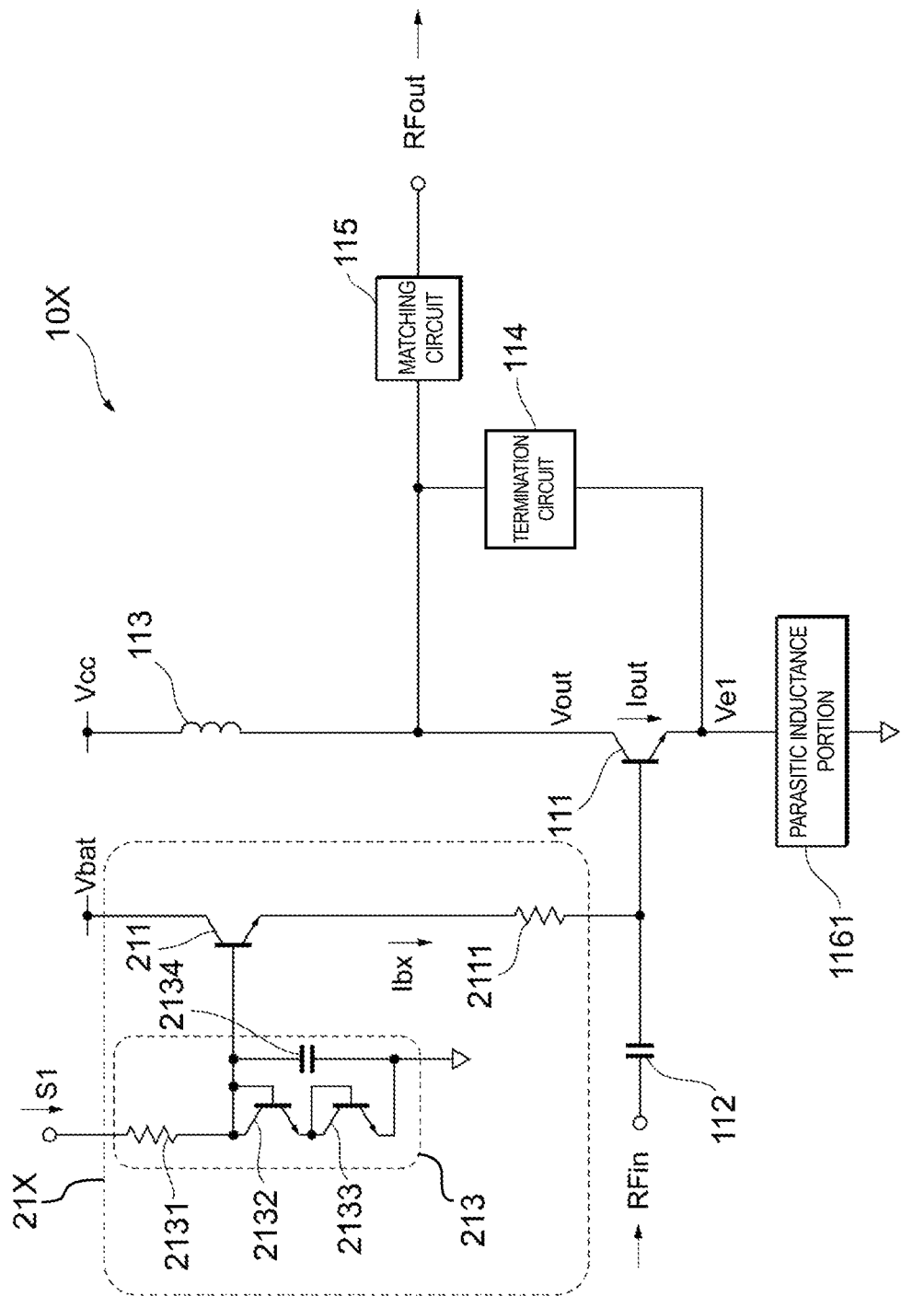
FIG. 9 is a diagram illustrating an example configuration of the power amplifying circuit according to the comparative example.

To describe an effect of the power amplifying circuit 10 according to this embodiment, the power amplifying circuit 10 is compared with a power amplifying circuit 10X (comparative example) illustrated in FIG. 9. The power amplifying circuit 10X is different from the power amplifying circuit 10 in not including the transistor 212.

Figure 2A:
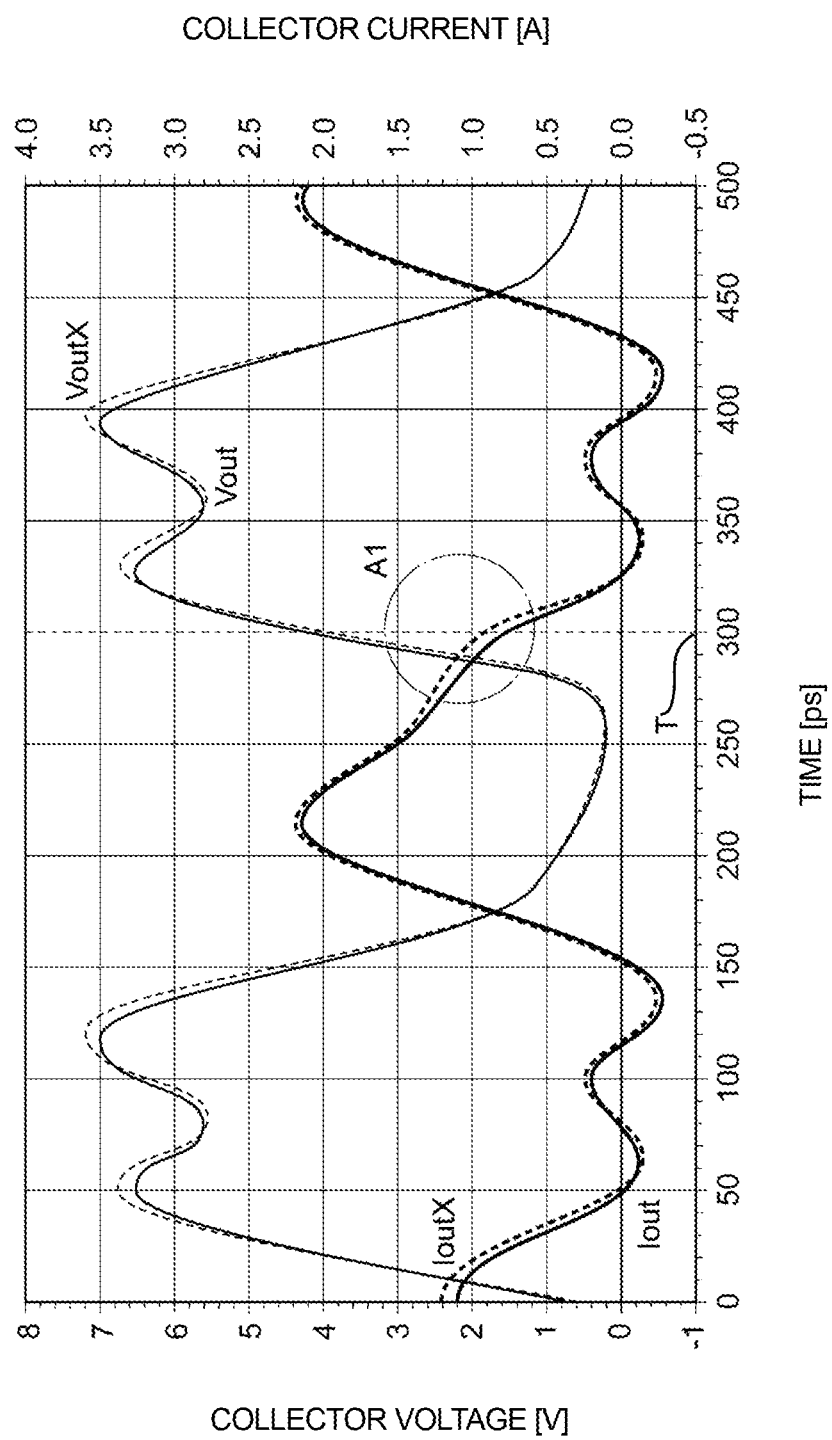
FIG. 2A is a graph illustrating changes in collector voltages and collector currents in a transistor of the power amplifying circuit according to the first embodiment and a transistor of a power amplifying circuit according to a comparative example.

A comparison is made between simulation results obtained by inputting the common input signal RFin to the power amplifying circuit 10 and the power amplifying circuit 10X. FIG. 2A illustrates collector voltages Vout and VoutX of the respective transistors 111 and collector currents Iout and IoutX of the respective transistors 111. The collector voltage Vout and the collector current Iout are represented by solid lines, whereas the collector voltage VoutX and the collector current IoutX are represented by broken lines.

In the power amplifying circuits 10 and 10X, it is difficult to ideally rectify the collector voltages Vout and VoutX and the collector currents Iout and IoutX, and some overlap occurs between the waveforms thereof.

Figure 2B:
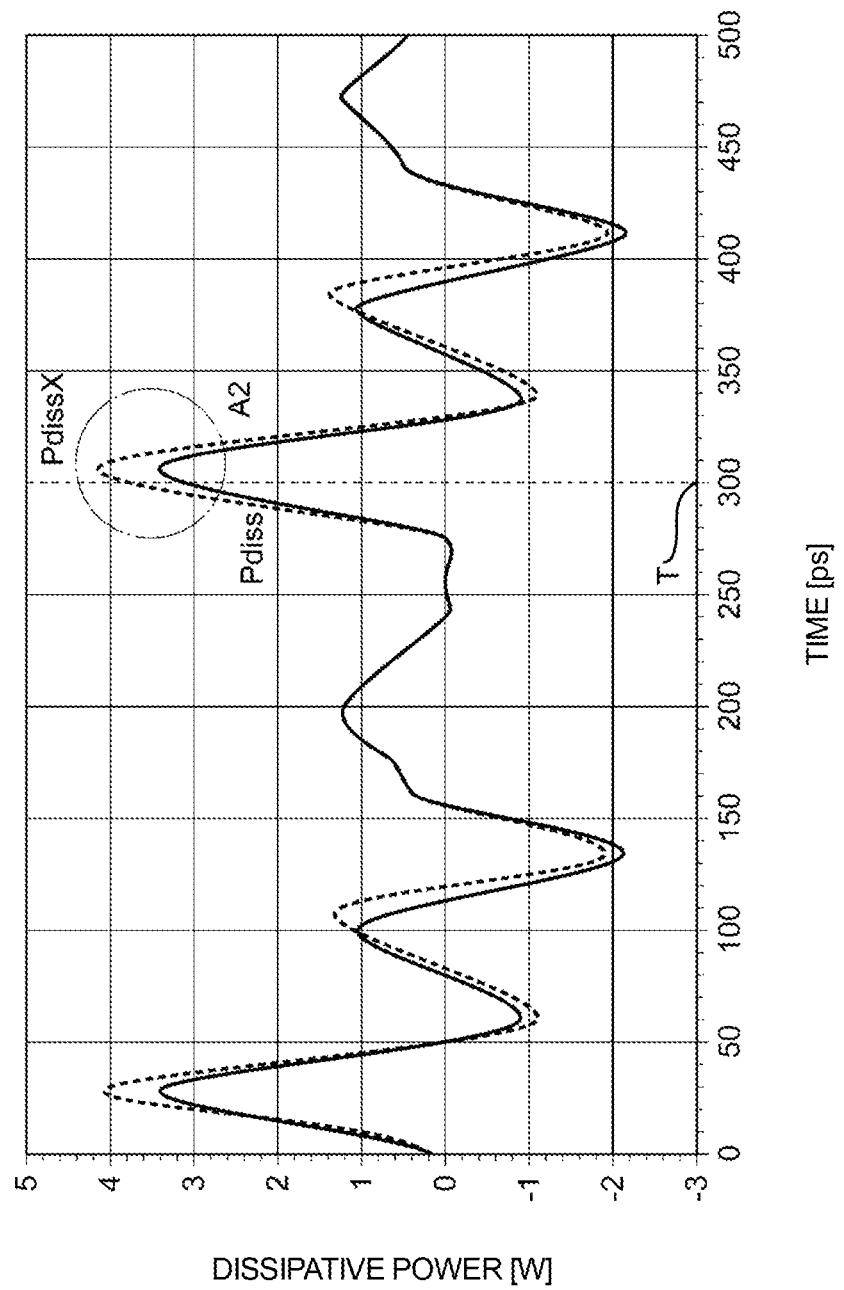
FIG. 2B is a graph illustrating changes in dissipative powers in the transistor of the power amplifying circuit according to the first embodiment and the transistor of the power amplifying circuit according to the comparative example.

FIG. 2B illustrates dissipative powers Pdiss and PdissX, each of which is obtained as the product of the collector voltage and the collector current of the transistor 111. The dissipative power Pdiss is the product of the collector voltage Vout and the collector current Iout. The dissipative power PdissX is the product of the collector voltage VoutX and the collector current IoutX. The dissipative power Pdiss is represented by a solid line, whereas the dissipative power PdissX is represented by a broken line. The horizontal axes in FIGS. 2A and 2B represent the same time range.

Attention is focused on time T, which is 300 ps, and thereabouts. As illustrated in a region A1 in FIG. 2A, both the collector currents Iout and IoutX change to decrease at and around time T. At this time, the collector current Iout changes while having a smaller value than the collector current IoutX. The collector voltages Vout and VoutX change to increase while having substantially the same value at and around time T.

The collector currents Iout and IoutX and the collector voltages Vout and VoutX, each has a positive value. At and around time T, the collector voltages Vout and VoutX significantly increase and thus the dissipative powers Pdiss and PdissX significantly increase.

The significant increase in the dissipative powers Pdiss and PdissX causes peaks of the dissipative powers Pdiss and PdissX illustrated in a region A2 in FIG. 2B. These peaks are not averaged even when time averages of the dissipative powers are taken, and the corresponding power is consumed in the respective transistors 111.

As illustrated in FIG. 2A, the collector current Iout changes while having a smaller value than the collector current IoutX in the region A1. Thus, as illustrated in the region A2, the peak of the dissipative power Pdiss is lower than the peak of the dissipative power PdissX. When the peak of the dissipative power Pdiss is lower than the peak of the dissipative power PdissX, the power consumed as dissipative power in the transistor 111 decreases and the power efficiency enhances.

Figure 3:
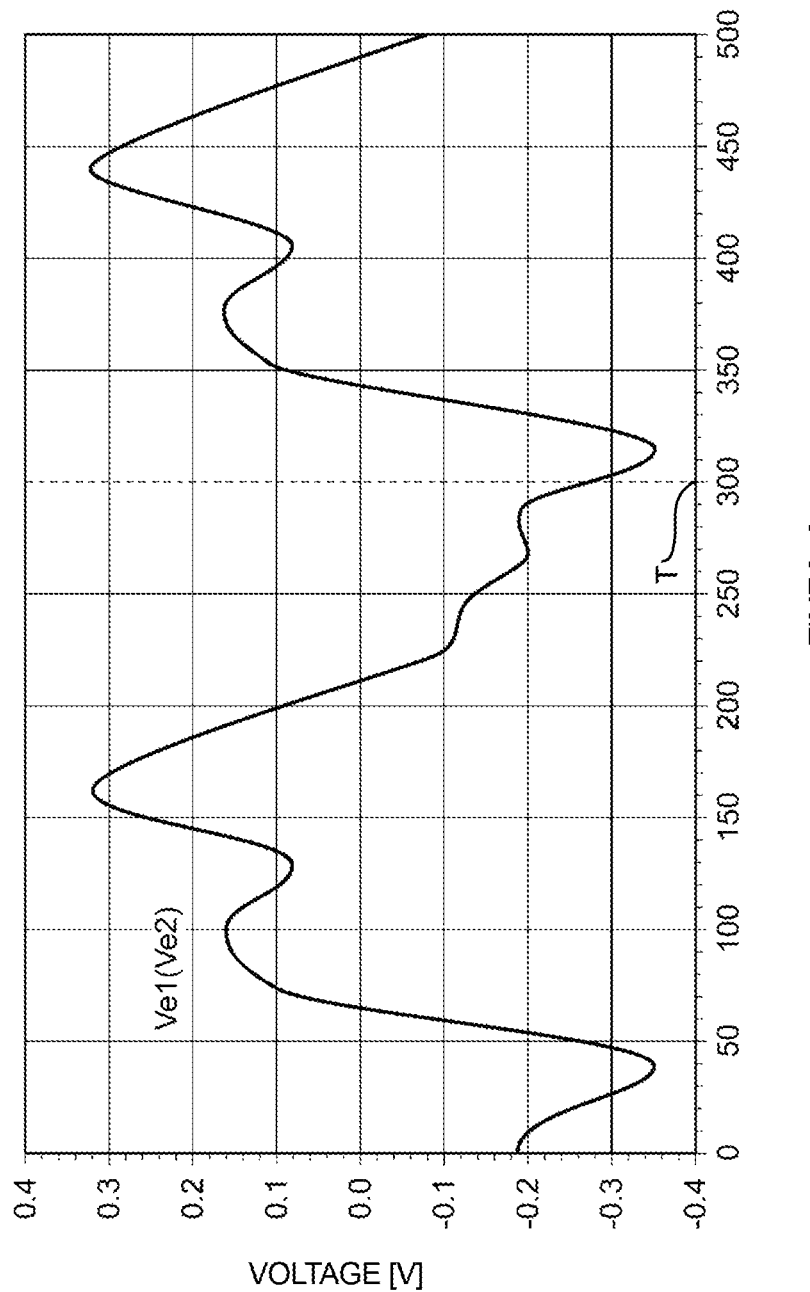
FIG. 3 is a graph illustrating changes in an emitter voltage of the transistor of the power amplifying circuit according to the first embodiment.

The reason for the occurrence of such an operation of the power amplifying circuit 10 will be described. FIG. 3 illustrates chronological changes in an emitter voltage Ve1 of the transistor 111 of the power amplifying circuit 10 in the same time range as that in FIGS. 2A and 2B.

In the power amplifying circuit 10, the inductance component of the parasitic inductance portion 1161 causes the emitter voltage Ve1 to be changed such that the phase thereof advances by about 90 degrees with respect to the collector current Iout. FIG. 3 illustrates that the emitter voltage Ve1 starts decreasing at or around 170 ps, which is before around 200 ps where the collector current Iout starts decreasing in FIG. 2A.

The emitter voltage Ve1 is also an emitter voltage Ve2 of the transistor 212. A decrease in the emitter voltage Ve1 causes a decrease in the emitter voltage Ve2 and an increase in the base-emitter voltage of the transistor 212. When the base-emitter voltage of the transistor 212 reaches a certain value, the transistor 212 enters an ON state.

When the transistor 212 is in an ON state, a shunt current Is flows through the transistor 212 as illustrated in FIG. 1. The shunt current Is is a current that branches off from the current output from the emitter of the transistor 211. Thus, the flow of the shunt current Is causes a decrease in the bias current Ib supplied to the transistor 111.

Figure 4:
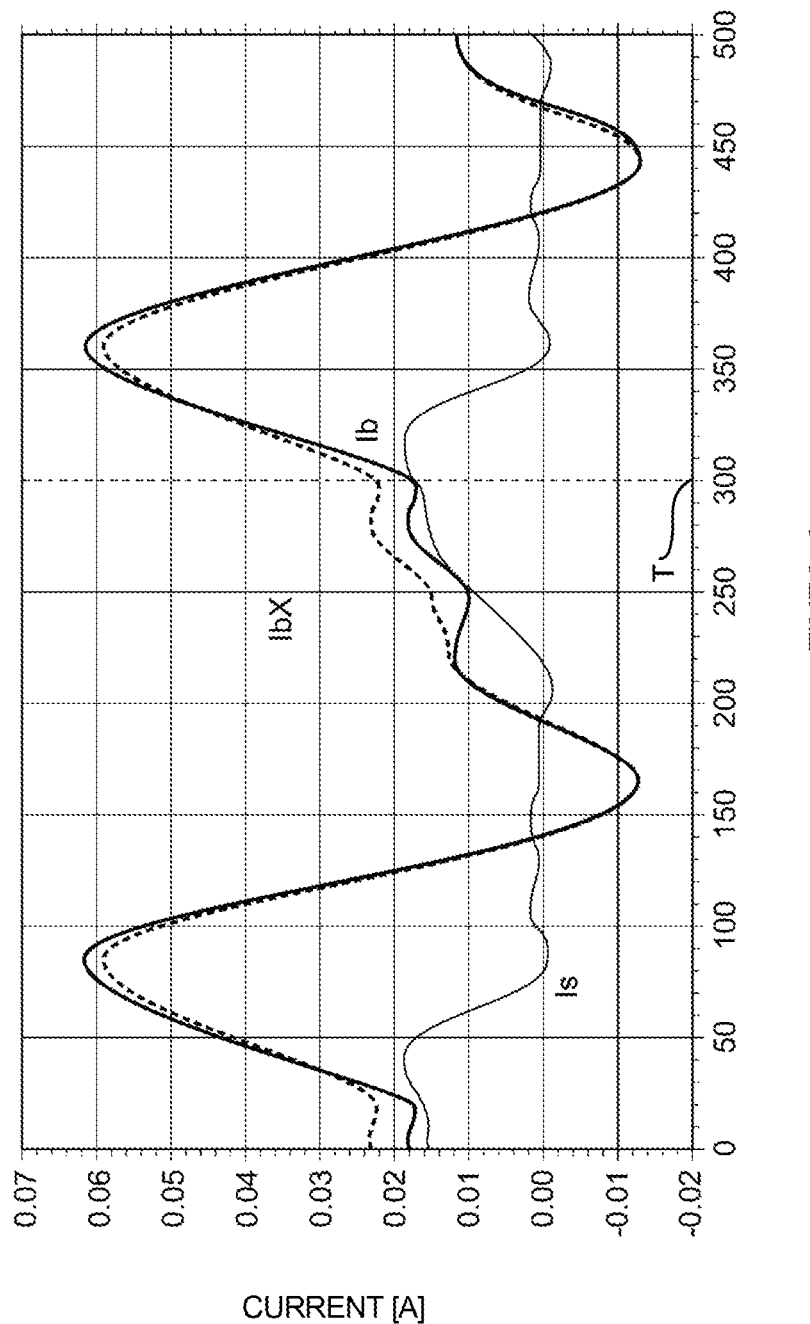
FIG. 4 is a graph illustrating changes in a shunt current and a bias current in the power amplifying circuit according to the first embodiment and a bias current in the power amplifying circuit according to the comparative example.

FIG. 4 illustrates chronological changes in the shunt current Is in the same time range as that in FIGS. 2A, 2B, and 3. FIG. 4 also illustrates chronological changes in the bias current Ib in the power amplifying circuit 10 and a bias current IbX in the power amplifying circuit 10X in the same time range as that in FIGS. 2A, 2B, and 3. The bias current Ib is represented by a solid line, whereas the bias current IbX is represented by a broken line.

As illustrated in FIG. 4, the shunt current Is starts increasing at or around 230 ps because of the decrease in the emitter voltage Ve1 illustrated in FIG. 3. The increase in the shunt current Is causes a decrease in the bias current Ib. Thus, the bias current Ib changes while having a smaller value than the bias current IbX in the power amplifying circuit 10X that does not include the transistor 212. In FIG. 4, the difference between the bias current Ib and the bias current IbX is significant in the range from 200 ps to 300 ps before time T.

The bias current Ib supplied to the transistor 111 is smaller than the bias current IbX. The collector currents Iout and IoutX are changed by the bias currents Ib and IbX. Thus, as illustrated in FIG. 2A, the collector current Iout changes while having a smaller value than the collector current IoutX. Such a change in the collector current Iout enables the dissipative power Pdiss to be smaller than the dissipative power PdissX.

Figure 5:
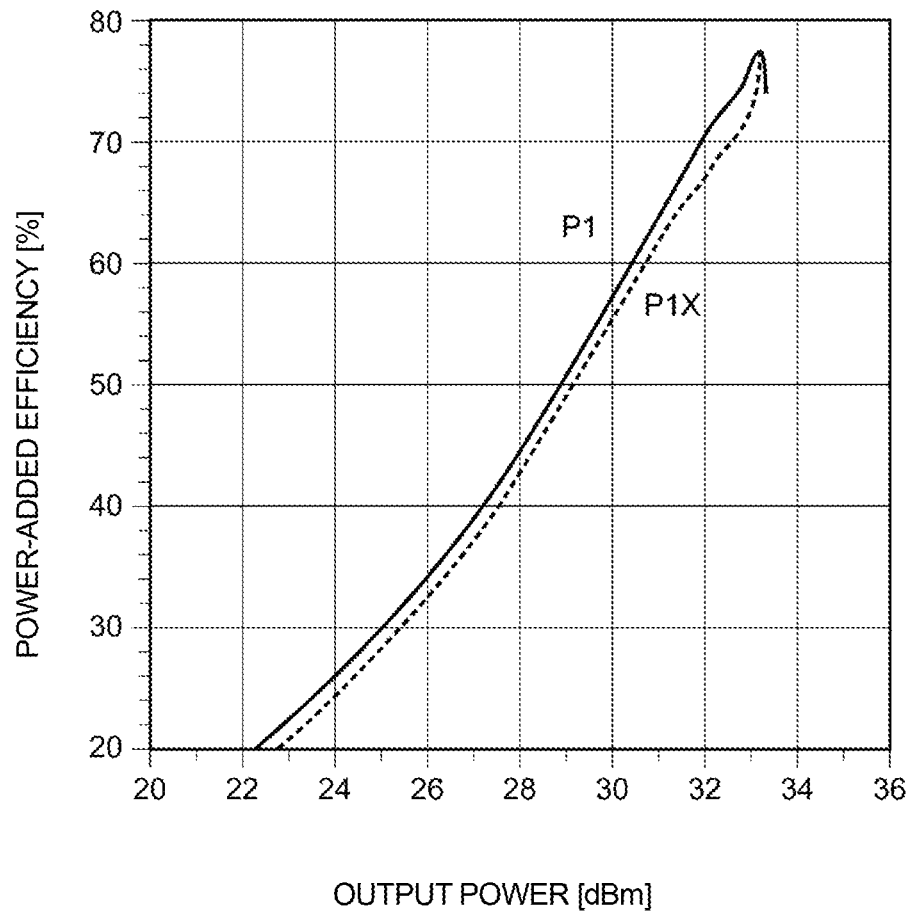
FIG. 5 is a graph illustrating the relationships between output power and power-added efficiency in the power amplifying circuit according to the first embodiment and the power amplifying circuit according to the comparative example.

FIG. 5 illustrates a PAE P1 in the power amplifying circuit 10 and a PAE P1X in the power amplifying circuit 10X, with the horizontal axis representing output power [dBm]. As will be understood from FIG. 5, the PAE P1 is higher than the PAE P1X, and the power amplifying circuit 10 achieves enhanced PAE.

The first embodiment has been described above. The power amplifying circuit 10 according to the first embodiment includes the bias circuit 21 that supplies a bias current or a bias voltage to the base of the transistor 111, and the at least one termination circuit 114 that short-circuits the second-order harmonic of the amplified signal output from the collector of the transistor 111 to the ground voltage. The emitter of the transistor 111 is connected to ground. The bias circuit 21 includes the transistor 212. The collector of the transistor 212 is connected to the base of the transistor 111. The emitter of the transistor 212 is connected to the emitter of the transistor 111. The base of the transistor 212 is supplied with a predetermined voltage.

The emitter of the transistor 212 is connected to the emitter of the transistor 111 connected to ground. The parasitic inductance component between the emitter of the transistor 111 and ground causes the emitter voltage Ve1 to be changed such that the phase thereof advances by about 90 degrees with respect to the collector current Iout of the transistor 111. The decrease in the emitter voltage Ve1 of the transistor 111 that occurs before the decrease in the collector current Iout causes the decrease in the emitter voltage Ve2 of the transistor 212.

Because the predetermined voltage is supplied to the base of the transistor 212, the decrease in the emitter voltage Ve2 causes the transistor 212 to enter an ON state. When the transistor 212 is in an ON state, the shunt current Is flows through the transistor 212. The flow of the shunt current Is decreases the bias current Ib supplied to the base of the transistor 111. The decreased bias current Ib enables the collector current Iout to be decreased earlier. This enables the occurrence of the peak of the dissipative power Pdiss to be suppressed and the PAE to be enhanced.

Figure 6:
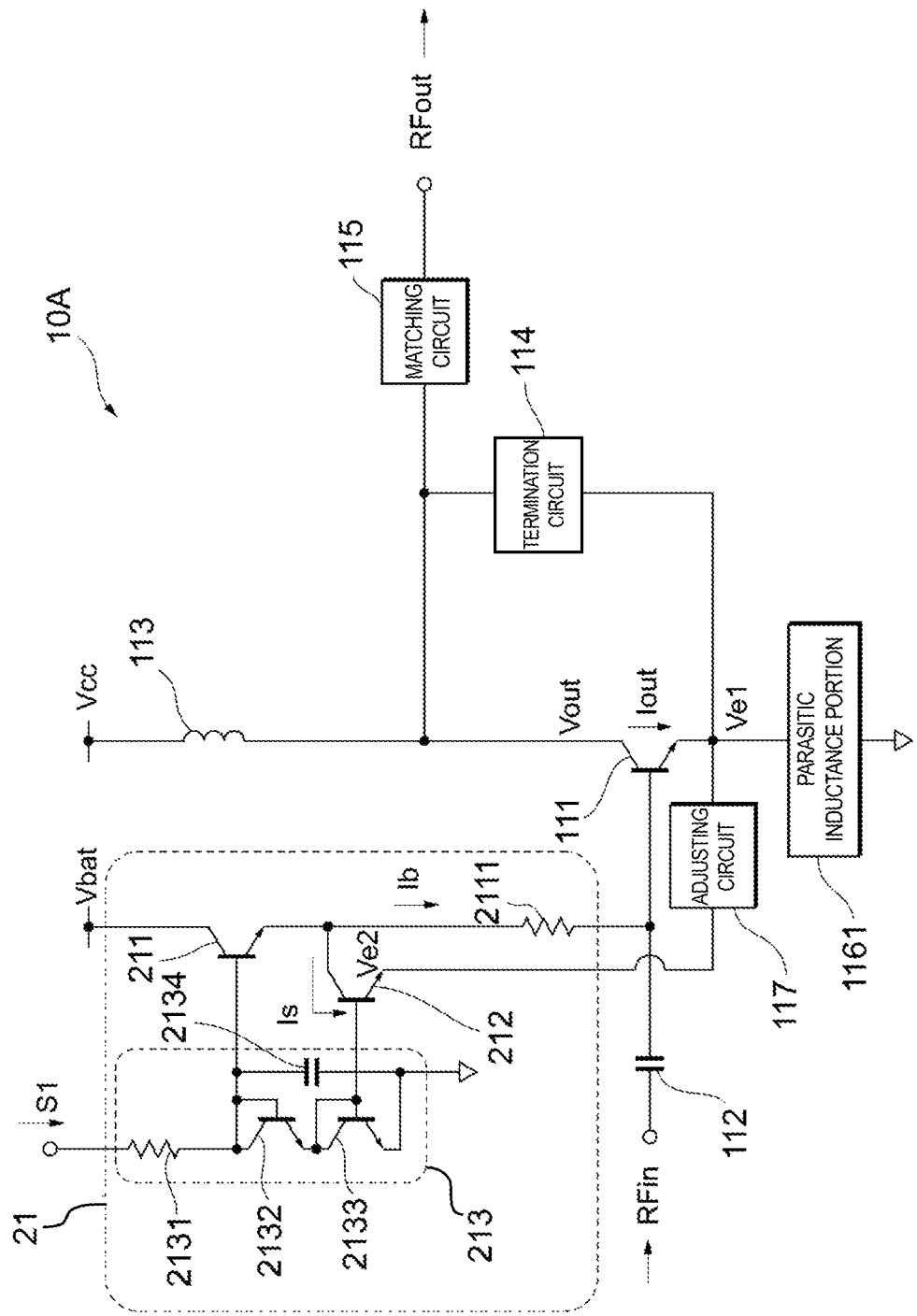
FIG. 6 is a diagram illustrating an example configuration of a power amplifying circuit according to a second embodiment.

A power amplifying circuit 10A according to a second embodiment will be described with reference to FIG. 6. In the second and following embodiments, a description of the same points as those of the first embodiment will be omitted, and only different points will be described. In particular, similar functions and effects of similar configurations will not be described in each embodiment.

In the power amplifying circuit 10A according to the second embodiment, the emitter of the transistor 212 is connected to the emitter of the transistor 111 via an adjusting circuit 117 including at least one of a resistance element and an inductance element. The operation of the power amplifying circuit 10A is similar to that of the power amplifying circuit 10 according to the first embodiment.

The adjusting circuit 117 is capable of adjusting the impedance between the emitter of the transistor 212 and the emitter of the transistor 111 by using at least one of the resistance element and the inductance element.

The adjusting circuit 117 is capable of adjusting an influence of the transistor 212 when the bias current Ib determined by the transistor 212 is branched. Thus, the PAE can be enhanced more effectively.

Figure 7:
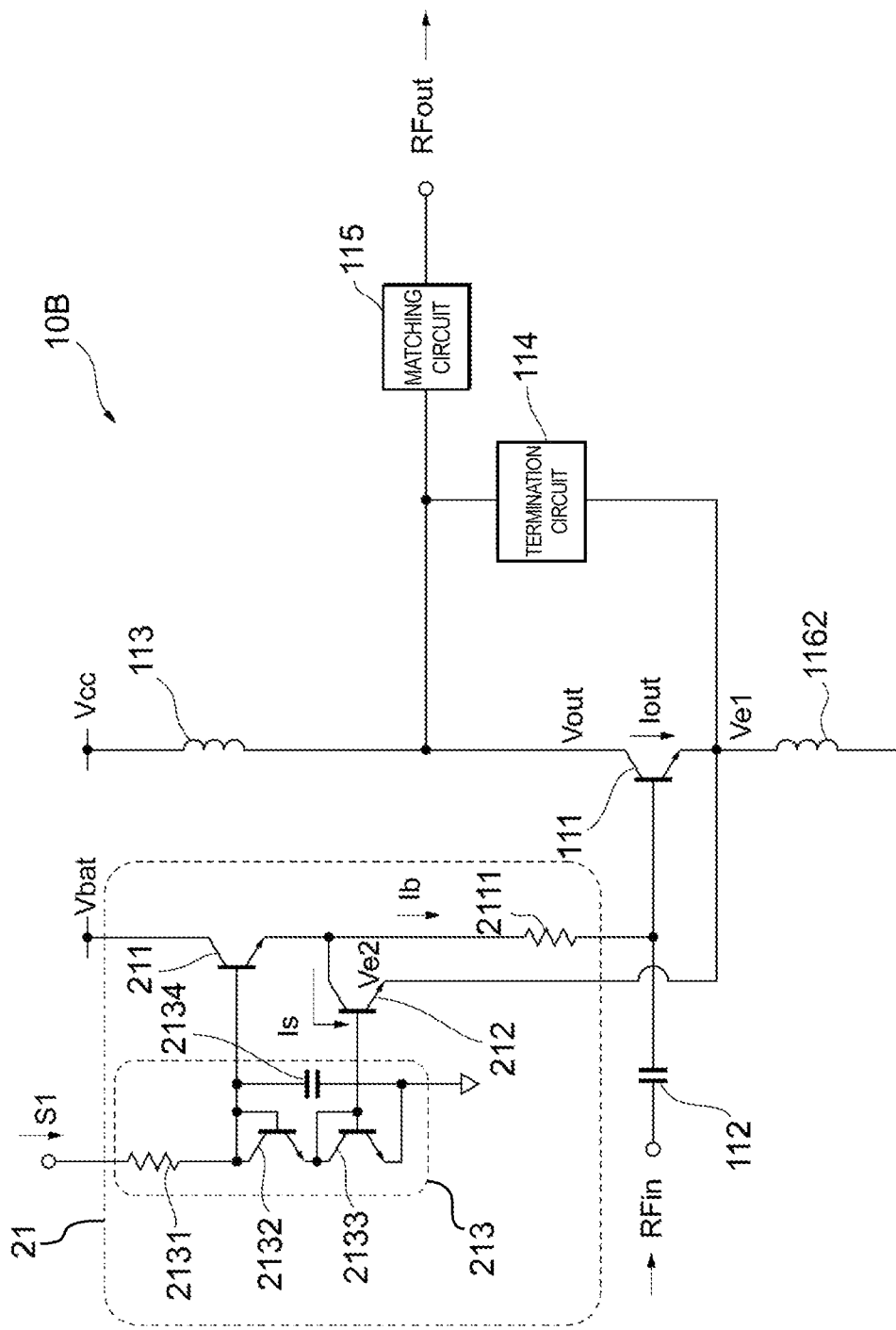
FIG. 7 is a diagram illustrating an example configuration of a power amplifying circuit according to a third embodiment.

A power amplifying circuit 10B according to a third embodiment will be described with reference to FIG. 7. The power amplifying circuit 10B includes an inductance element 1162 disposed between the emitter of the transistor 111 and ground.

In the power amplifying circuit 10, a decrease in the collector current Iout is detected as a decrease in the emitter voltage Ve1 caused by the inductance component of the parasitic inductance portion 1161. In the power amplifying circuit 10B, the inductance component between the emitter of the transistor 111 and ground can be set to a predetermined value by the inductance element 1162.

The inductance element 1162 enables the bias current Ib and the collector current Iout that are determined by the transistor 212 to be appropriately adjusted. Thus, the PAE can be enhanced more effectively.

The inductance element 1162 may be disposed on or in a substrate (not illustrated) of the power amplifying circuit 10B.

Figure 8:
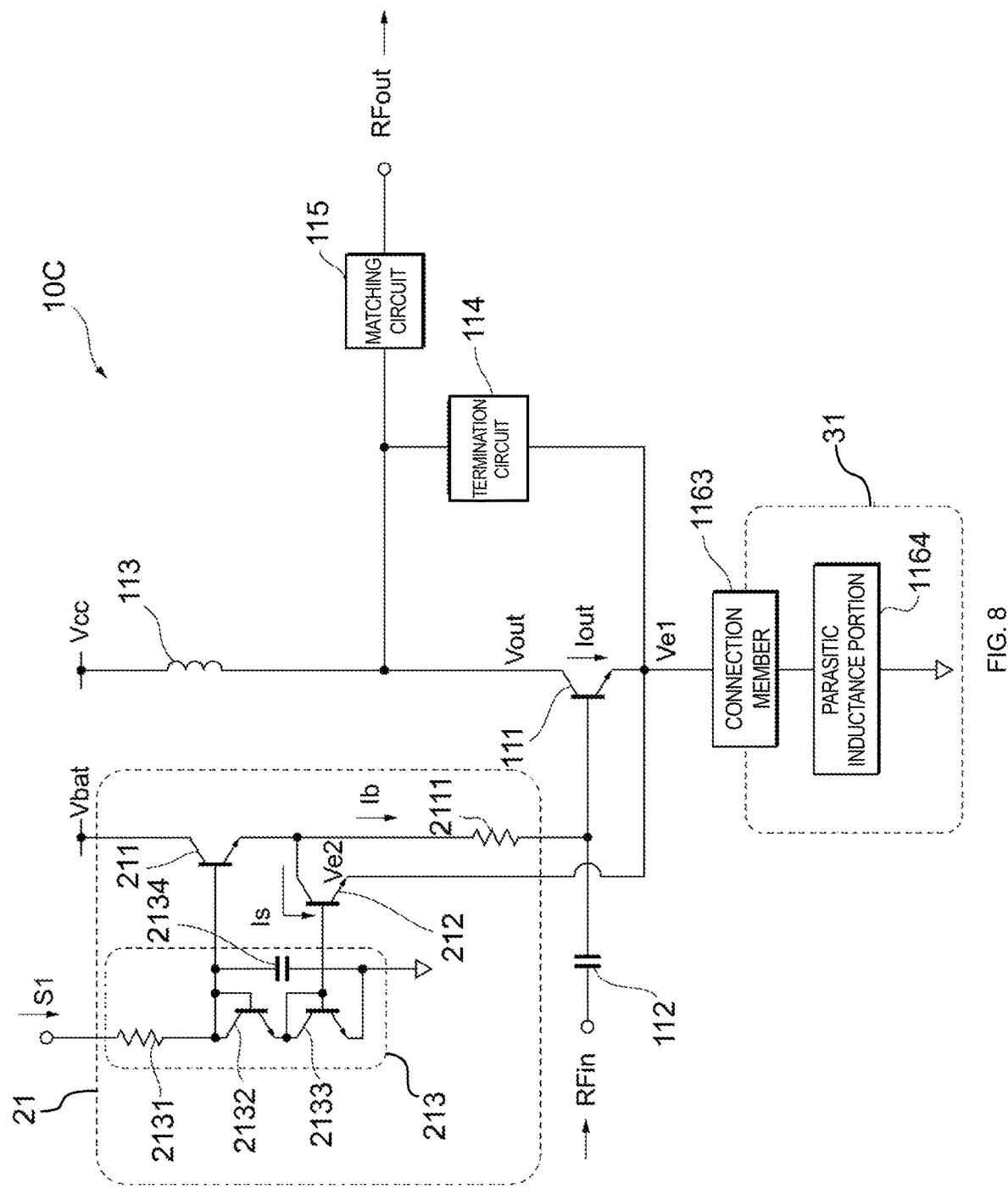
FIG. 8 is a diagram illustrating an example configuration of a power amplifying circuit according to a fourth embodiment.

A power amplifying circuit 10C according to a fourth embodiment will be described with reference to FIG. 8. In the power amplifying circuit 10C, the emitter of the transistor 111 is electrically connected to a substrate 31 of the power amplifying circuit 10C via a connection member 1163. The connection member 1163 is, for example, a bump or a through via.

In the power amplifying circuit 10C, it is assumed that the parasitic inductance component of the substrate 31 derives from a parasitic inductance portion 1164. The parasitic inductance portion 1164 of the substrate 31 is made up of, for example, a wiring line of the substrate 31.

In the power amplifying circuit 10C, an inductance component generated by the connection member 1163 and the parasitic inductance portion 1164 is present between the emitter of the transistor 111 and ground. Thus, the power amplifying circuit 10C is capable of operating similarly to the power amplifying circuit 10, and thus the PAE can be enhanced.

An inductance component generated by the connection member 1163 enables the power amplifying circuit 10C to operate similarly to the power amplifying circuit 10. In this case, the inductance component in the substrate 31 need not necessarily be handled by focusing attention thereon like the parasitic inductance portion 1164.

The above-described embodiments are given for easy understanding of the present disclosure and are not for limiting the interpretation of the present disclosure. The embodiments can be changed or improved without necessarily deviating from the gist of the present disclosure, and the embodiments include the equivalents thereof. In other words, each embodiment that has been changed in design by a person skilled in the art as appropriate is included in the scope of the present disclosure as long as the embodiment has a feature of the present disclosure. For example, the components and their arrangements, materials, conditions, shapes, sizes, and the like in each embodiment are not limited to those illustrated above and can be changed as appropriate. Each embodiment is merely an example, and it is obviously possible to partially replace or combine components described in different embodiments. The replacement or combination is also included in the scope of the present disclosure as long as it has a feature of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifying circuit comprising:
a first transistor having a base, a collector, and an emitter;
a bias circuit configured to supply a bias current or a bias voltage to the base of the first transistor; and
a termination circuit configured to short-circuit a second-order harmonic of an amplified signal to a ground voltage, the amplified signal being output from the collector of the first transistor, wherein:
the emitter of the first transistor is connected to ground,
the bias circuit comprises a second transistor having a base, a collector, and an emitter,
the collector of the second transistor is connected to the base of the first transistor,
the emitter of the second transistor is connected to the emitter of the first transistor, and
the base of the second transistor is supplied with a predetermined voltage.

2. The power amplifying circuit according to claim 1, wherein the emitter of the second transistor is connected to the emitter of the first transistor via an adjusting circuit, the adjusting circuit comprising a resistance element or an inductance element.

3. The power amplifying circuit according to claim 1, further comprising an inductance element connected between the emitter of the first transistor and ground.

4. The power amplifying circuit according to claim 2, further comprising an inductance element connected between the emitter of the first transistor and ground.

5. The power amplifying circuit according to claim 1, wherein the emitter of the first transistor is electrically connected to a substrate of the power amplifying circuit.

6. The power amplifying circuit according to claim 2, wherein the emitter of the first transistor is electrically connected to a substrate of the power amplifying circuit.

7. The power amplifying circuit according to claim 5, wherein the emitter of the first transistor is electrically connected to the substrate of the power amplifying circuit by a through via or a bump.

8. The power amplifying circuit according to claim 6, wherein the emitter of the first transistor is electrically connected to the substrate of the power amplifying circuit by a through via or a bump.

9. The power amplifying circuit according to claim 1, wherein the termination circuit is connected to the emitter of the first transistor such that the termination circuit is configured to short-circuit the second-order harmonic to the ground voltage via the emitter of the first transistor.

10. The power amplifying circuit according to claim 2, wherein the termination circuit is connected to the emitter of the first transistor such that the termination circuit is configured to short-circuit the second-order harmonic to the ground voltage via the emitter of the first transistor.

11. The power amplifying circuit according to claim 3, wherein the termination circuit is connected to the emitter of the first transistor such that the termination circuit is configured to short-circuit the second-order harmonic to the ground voltage via the emitter of the first transistor.

12. The power amplifying circuit according to claim 4, wherein the termination circuit is connected to the emitter of the first transistor such that the termination circuit is configured to short-circuit the second-order harmonic to the ground voltage via the emitter of the first transistor.

13. The power amplifying circuit according to claim 5, wherein the termination circuit is connected to the emitter of the first transistor such that the termination circuit is configured to short-circuit the second-order harmonic to the ground voltage via the emitter of the first transistor.

14. The power amplifying circuit according to claim 6, wherein the termination circuit is connected to the emitter of the first transistor such that the termination circuit is configured to short-circuit the second-order harmonic to the ground voltage via the emitter of the first transistor.

15. The power amplifying circuit according to claim 1, wherein the first transistor and the second transistor are heterojunction bipolar transistors.

16. The power amplifying circuit according to claim 3, wherein the inductance element comprises a wiring line of a substrate of the power amplifying circuit.

17. The power amplifying circuit according to claim 4, wherein the inductance element comprises a wiring line of a substrate of the power amplifying circuit.

18. The power amplifying circuit according to claim 16, wherein the inductance element further comprises a bump connected to the wiring line.

19. The power amplifying circuit according to claim 17, wherein the inductance element further comprises a bump connected to the wiring line.

\* \* \* \* \*

UNITED STATES PATENT AND TRADEMARK OFFICE
CERTIFICATE OF CORRECTION

| | | |
|---|---|---|
| PATENT NO. | : 11,211,899 B2 | Page 1 of 1 |
| APPLICATION NO. | : 16/823815 | |
| DATED | : December 28, 2021 | |
| INVENTOR(S) | : Hideyuki Satou | |

It is certified that error appears in the above-identified patent and that said Letters Patent is hereby corrected as shown below:

In the Specification

Column 6, Line 5, "PIX" should be -- P1X --.

Signed and Sealed this
Twentieth Day of September, 2022

Katherine Kelly Vidal
*Director of the United States Patent and Trademark Office*